United States Patent
Goel et al.

(10) Patent No.: US 10,156,607 B2
(45) Date of Patent: Dec. 18, 2018

(54) BIDIRECTIONAL SCAN CHAIN STRUCTURE AND METHOD

(71) Applicant: Taiwan Semiconductor Manufacturing Co., Ltd, Hsin-Chu (TW)

(72) Inventors: Sandeep Kumar Goel, Dublin, CA (US); Yun-Han Lee, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/135,083

(22) Filed: Apr. 21, 2016

(65) Prior Publication Data

US 2017/0307683 A1 Oct. 26, 2017

(51) Int. Cl.
*G01R 31/00* (2006.01)
*G01R 31/3177* (2006.01)
*G01R 31/317* (2006.01)

(52) U.S. Cl.
CPC ... *G01R 31/3177* (2013.01); *G01R 31/31712* (2013.01)

(58) Field of Classification Search
None
See application file for complete search history.

(56) References Cited

U.S. PATENT DOCUMENTS

| | | | | |
|---|---|---|---|---|
| 5,202,625 A * | 4/1993 | Farwell | ............ | G01R 31/31855 324/73.1 |
| 5,915,084 A * | 6/1999 | Wendell | .................. | G11C 7/06 365/201 |
| 6,990,076 B1 * | 1/2006 | McNamara | ...... | G01R 31/31859 370/241 |
| 9,128,151 B1 * | 9/2015 | Charlebois | ..... | G01R 31/318536 |
| 2013/0297980 A1 * | 11/2013 | Chen | .................. | G01R 31/3177 714/726 |
| 2014/0132290 A1 * | 5/2014 | Charlebois | ....... | G01R 31/31858 324/750.01 |
| 2014/0143621 A1 * | 5/2014 | Tekumalla | ..... | G01R 31/318572 714/727 |

OTHER PUBLICATIONS

Authors et al., "Bidirectional Scan Chain for Digital Circuit Testing", IP.com No. IPCOM000160595D, Nov. 21, 2007.*

* cited by examiner

*Primary Examiner* — Daniel F. McMahon
(74) *Attorney, Agent, or Firm* — Duane Morris LLP

(57) ABSTRACT

A bi-directional scan chain includes a plurality of cell structures, each cell structure having a storage device and at least one multiplexer, the plurality of cell structures coupled to one another in a series configuration, wherein an output of a (K−1)-th cell structure is provided as input to the K-th cell structure to provide a forward data shifting operation, and an output of the K-th cell structure is provided as an input to the (K−1)-th cell structure to provide a backward data shifting operation, where K is an integer greater than 1.

19 Claims, 15 Drawing Sheets

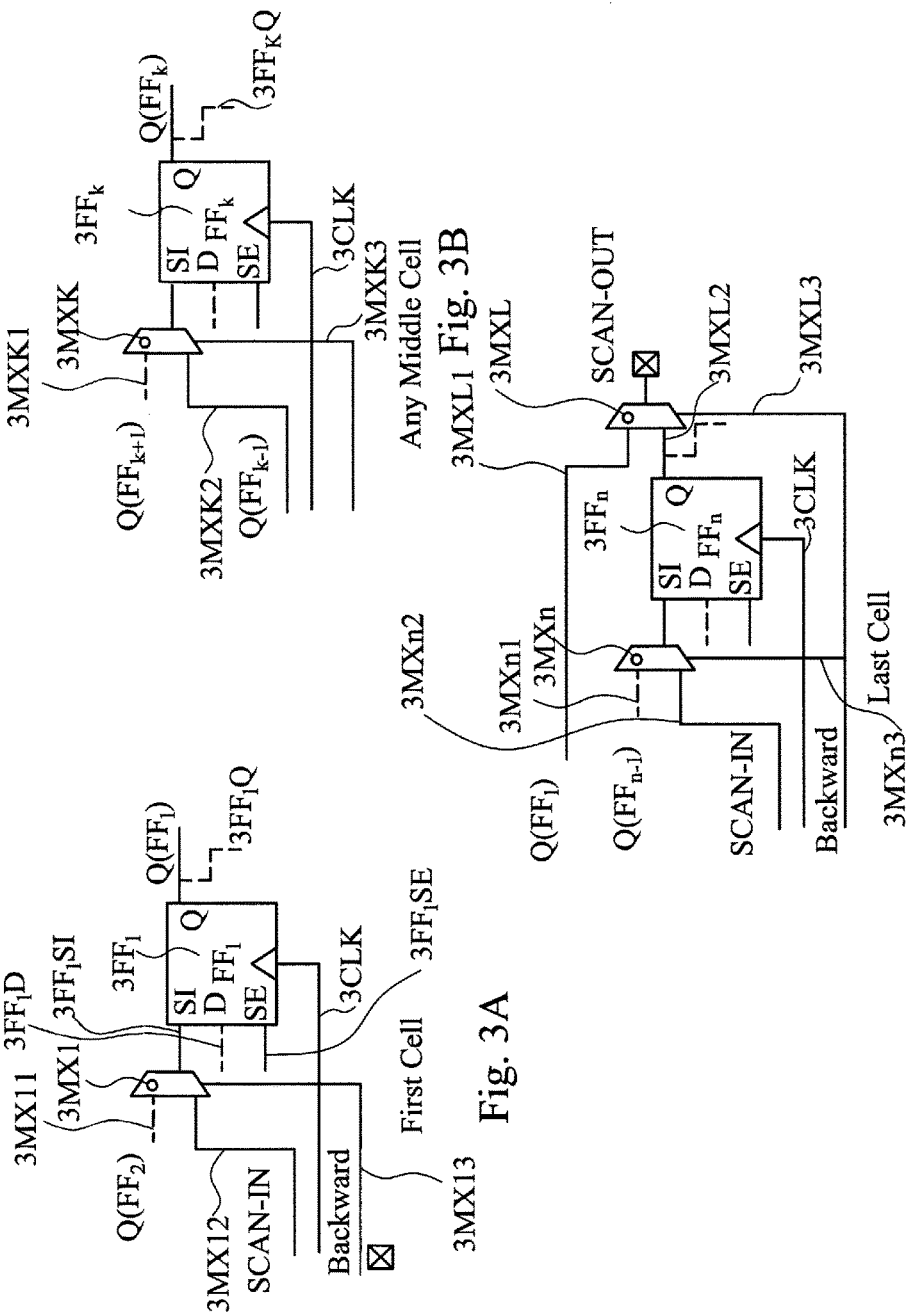

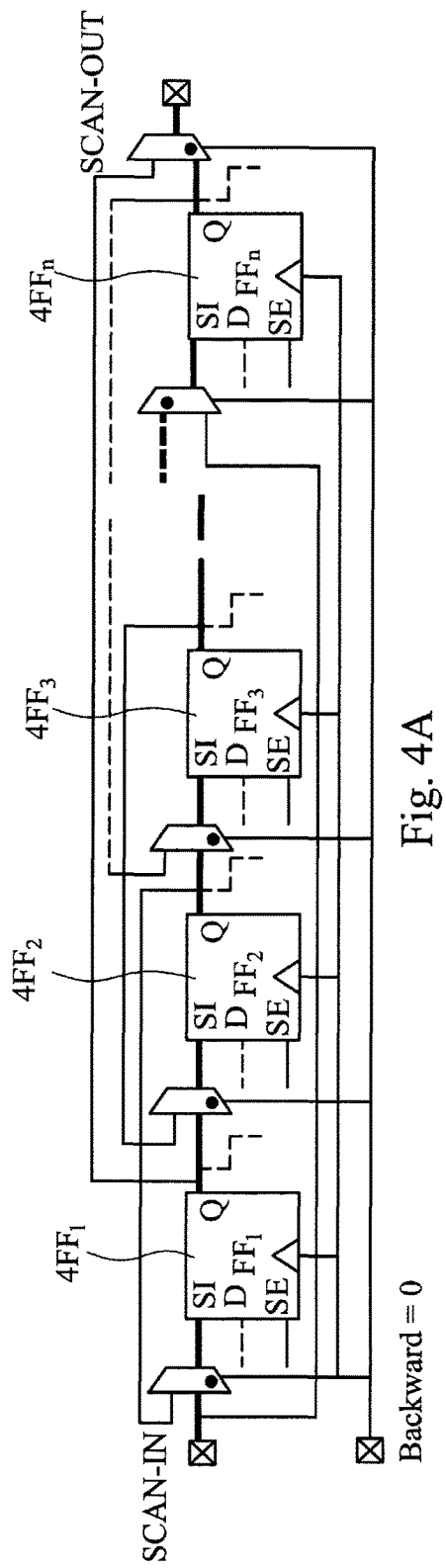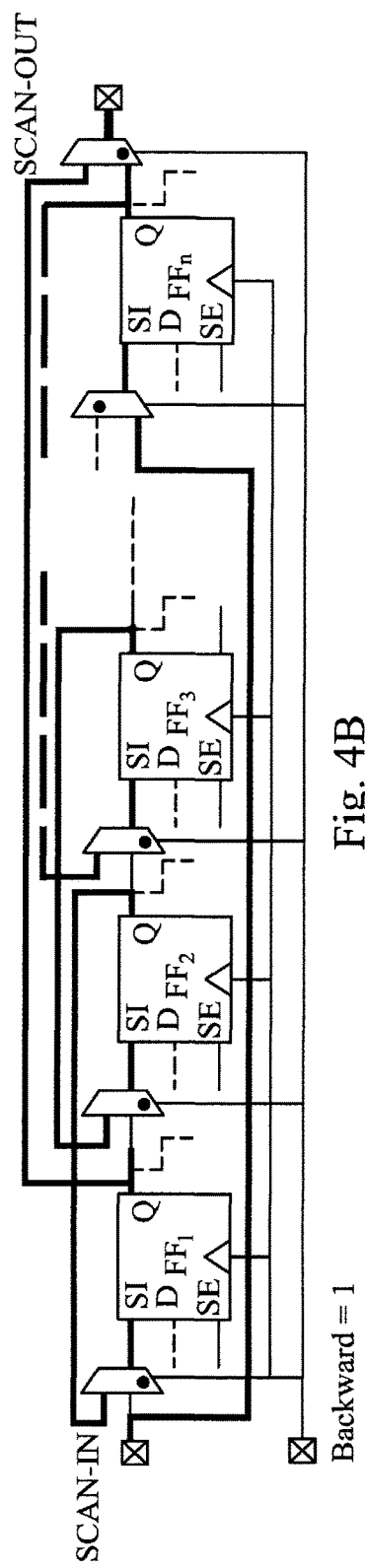
Fig. 4A
Fig. 4B

Backward = 0, CLK = 1-4 cycles

Backward = 1, CLK = 5-8 cycles

Backward = 1, CLK = 1-4 cycles

Backward = 0, CLK = 5-8 cycles

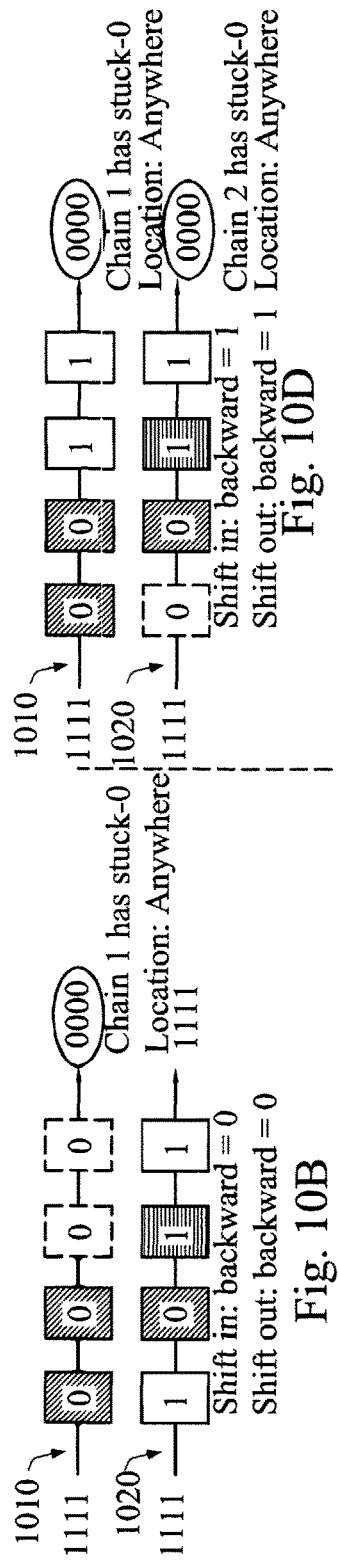
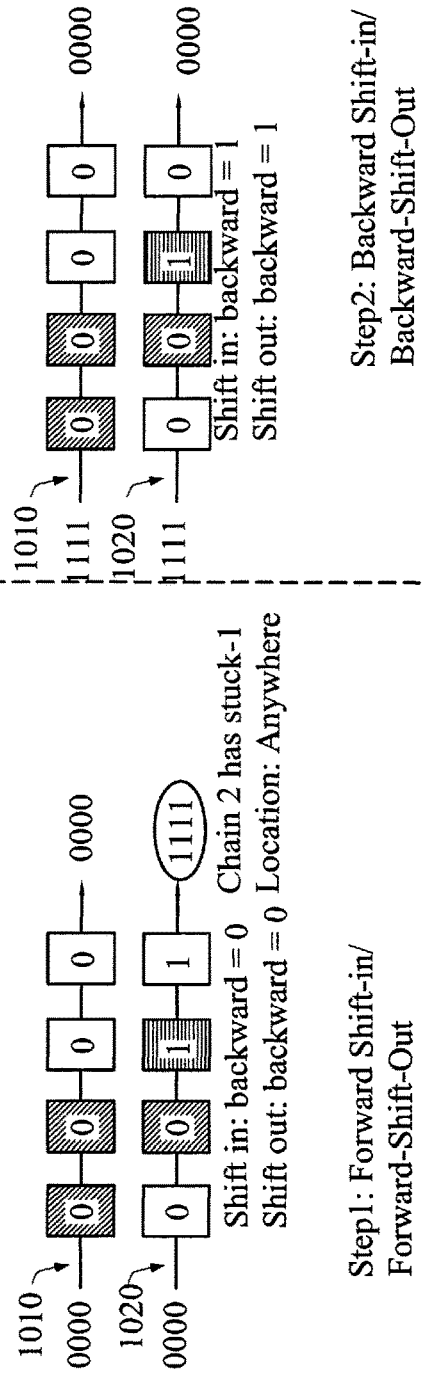
Fig. 10B
Fig. 10C
Fig. 10D
Fig. 10E
Step1: Forward Shift-in/ Forward-Shift-Out
Step2: Backward Shift-in/ Backward-Shift-Out

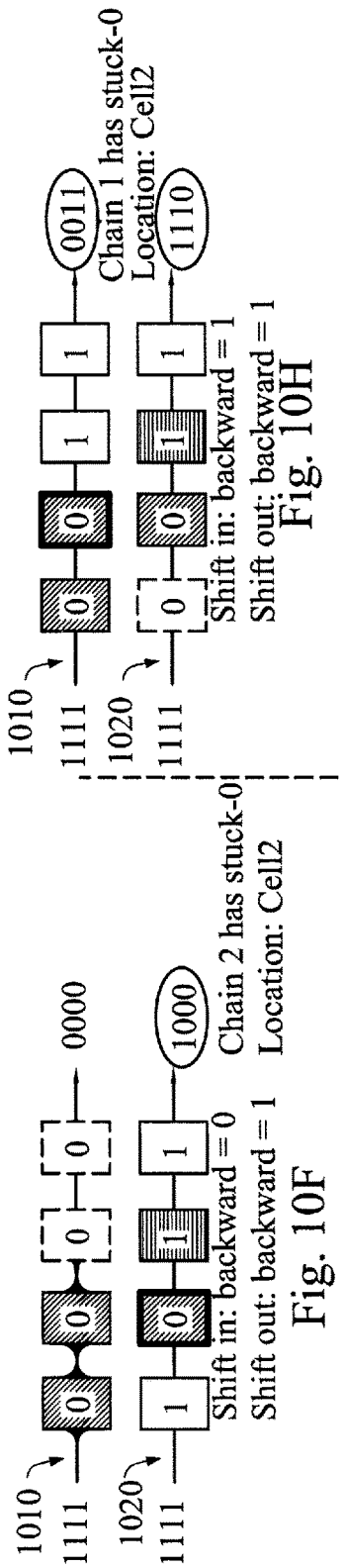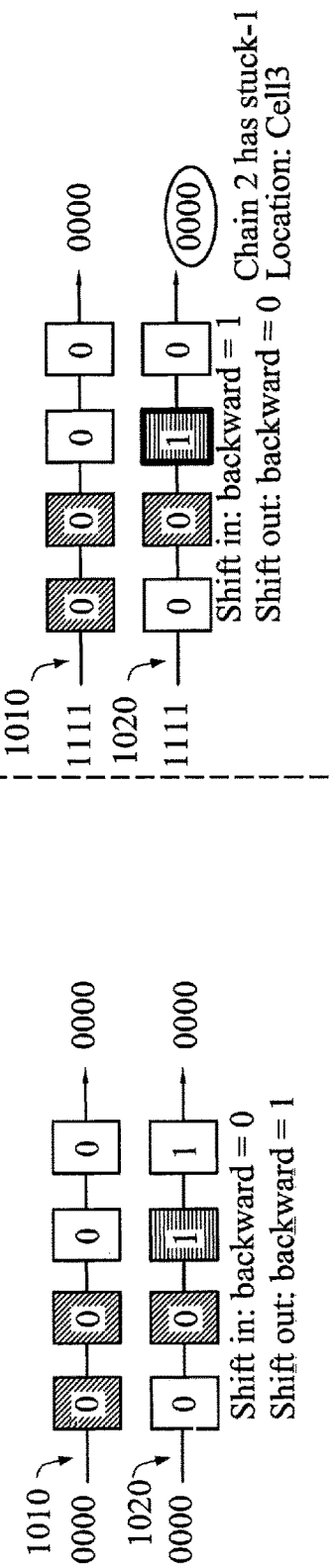

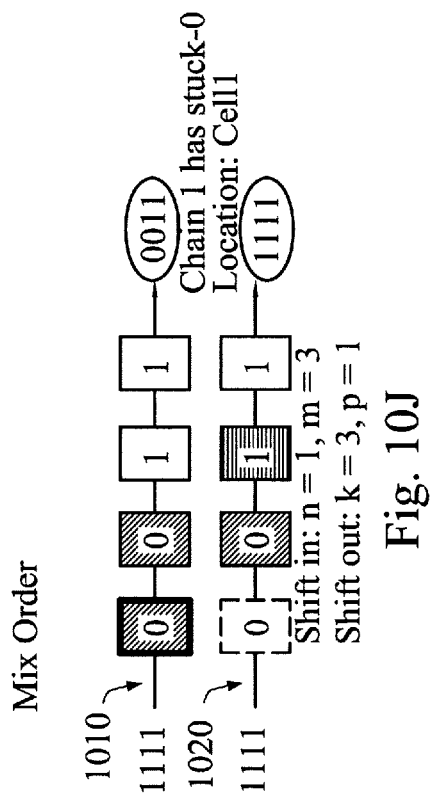
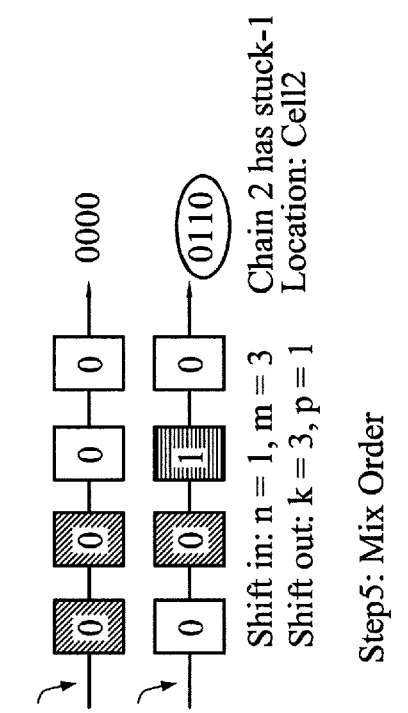
Fig. 10J
Fig. 10k

BIDIRECTIONAL SCAN CHAIN STRUCTURE AND METHOD

BACKGROUND

Application specific integrated circuits (ASICs) routinely achieve densities of millions of gates per chip, which presents an especially difficult testing challenge. ASICs are typically designed by combining pre-defined, standard functional blocks called core cells from a variety of sources with discrete logic to perform a desired function or group of functions. Although standard test vectors or test strategies may be supplied with the core cells, their internal connections to one another inside the ASIC are frequently inaccessible from the pins of the ASIC, rendering the standard tests unusable and complicating the testing procedure.

A common technique used to gain access to core cells inside an ASIC is known as full-scan design, in which every flip-flop of a logic circuit has a multiplexer placed at its data input, so that when a test mode signal is applied to the control input of the multiplexers, all the flip-flops are chained together into a shift register or scan chain. The scan chain is formed by connecting Q from a flip-flop to the SI of the next flip-flop. The test mode signal/scan enable signal of the multiplexer determines which signal (SI or D) is captured in the flip-flop and made available at Q. A scan test is performed by clocking test patterns into the shift register and clocking out the test results.

Very large scale integrated ("VLSI") circuits include scan chains for testing some or all parts of the integrated circuit. A scan chain typically includes a plurality of flip-flops that are shifted to set the integrated circuit in a given state and determine if each part of the integrated circuit operates correctly. However, scan chains are only effective if the scan chains themselves are operable and do not include defects. A defect in a scan chain can prevent proper testing of the integrated circuit as it may prevent a circuit from being set in a given state.

BRIEF DESCRIPTION OF THE DRAWINGS

Aspects of the present disclosure are best understood from the following detailed description when read with the accompanying figures. It is noted that, in accordance with the standard practice in the industry, various features are not necessarily drawn to scale. In fact, the dimensions of the various features may be arbitrarily increased or reduced for clarity of discussion.

FIG. 3A is a schematic diagram illustrating a "first cell" structure in a bi-directional scan chain structure in accordance with some embodiments.

FIG. 3B is a schematic diagram illustrating a "middle cell" structure in a bi-directional scan chain structure in accordance with some embodiments.

FIG. 3C is a schematic diagram illustrating a "last cell" structure in a bi-directional scan chain structure in accordance with some embodiments.

FIG. 4A is a schematic diagram illustrating a forward scanning on a bi-directional scan chain when BACKWARD=0 in accordance with some embodiments.

FIG. 4B is a schematic diagram illustrating a backward scanning on a bi-directional scan chain when BACKWARD=1 in accordance with some embodiments.

FIG. 10A through FIG. 10K illustrate steps of a method of multiple defects detection of multiple faulty chains using a bi-directional scan chain in accordance with some embodiments.

DETAILED DESCRIPTION OF EXEMPLARY EMBODIMENTS

Figure 1:
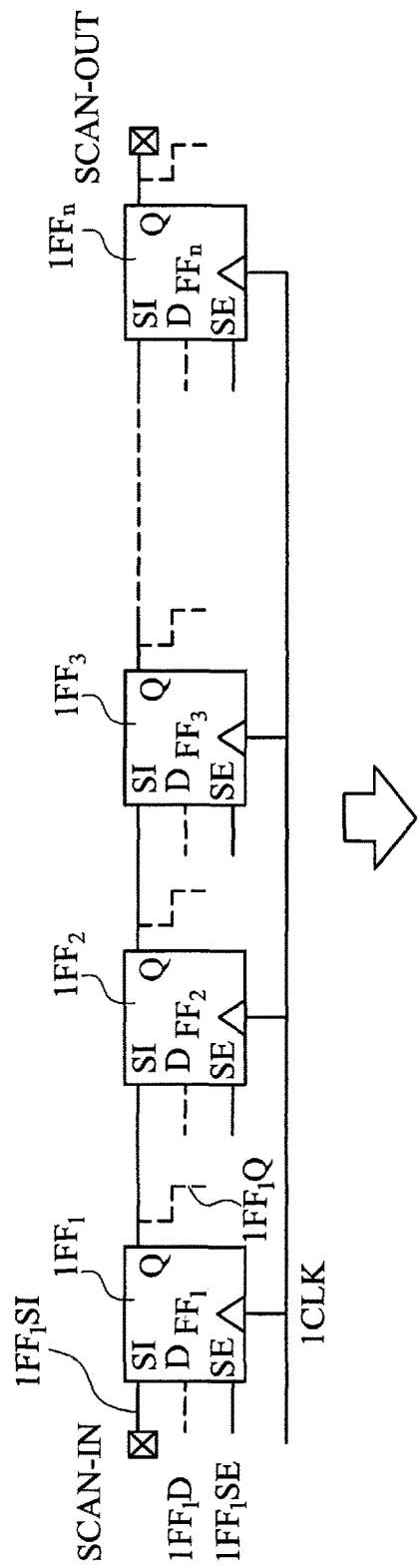
FIG. 1 is a schematic diagram illustrating a conventional one-directional scan chain structure.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in of itself dictate a relationship between the various embodiments and/or configurations discussed.

Further, spatially relative terms, such as "beneath," "below," "lower," "above," "upper", "left", "right", "backward", "forward" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, it will be understood that when an element is referred to as being "connected to" or "coupled to" another element, it may be directly connected to or coupled to the other element, or one or more intervening elements may be present.

FIG. 1 is a schematic diagram illustrating a conventional one-directional scan chain structure. There are n flip-flops in the one-directional scan chain structure in FIG. 1, the first flip-flop is labeled as 1FF1, the second is labeled as 1FF2, the third is labeled as 1FF3, and the n-th flip-flop is labeled as 1FFn. The first number in the labels designates the figure number, for example, the first number "1" in the above labels designates FIG. 1.

Each flip-flop has three inputs: SI, D and SE, with SI designating "Shift-In", D designating "Data" and SE designating "Shift-Enable". The SI, D and SE of the first flip-flop are designated as 1FF1_SI, 1FF1_D and 1FF1_SE. Each flip-flop also has a clock input for receiving a clock signal (1CLK) that controls the timing of operations for each flip-flop, as discussed in further detail below. Following the same logic, the output Q is designated 1FF1_Q. Dashed lines in the figure designate functional connections not related to the description of the scan chain structure and may be coming in and going to the functional logic of the design where scan chain is used. The same naming convention applies to the rest of the figures. The one-directional scan chain of FIG. 1 allows for only forward shift operations, where SCAN-IN data is successively shifted at each clock cycle from a first flip-flop to a next flip-flop down the chain in serial fashion.

Figure 2:
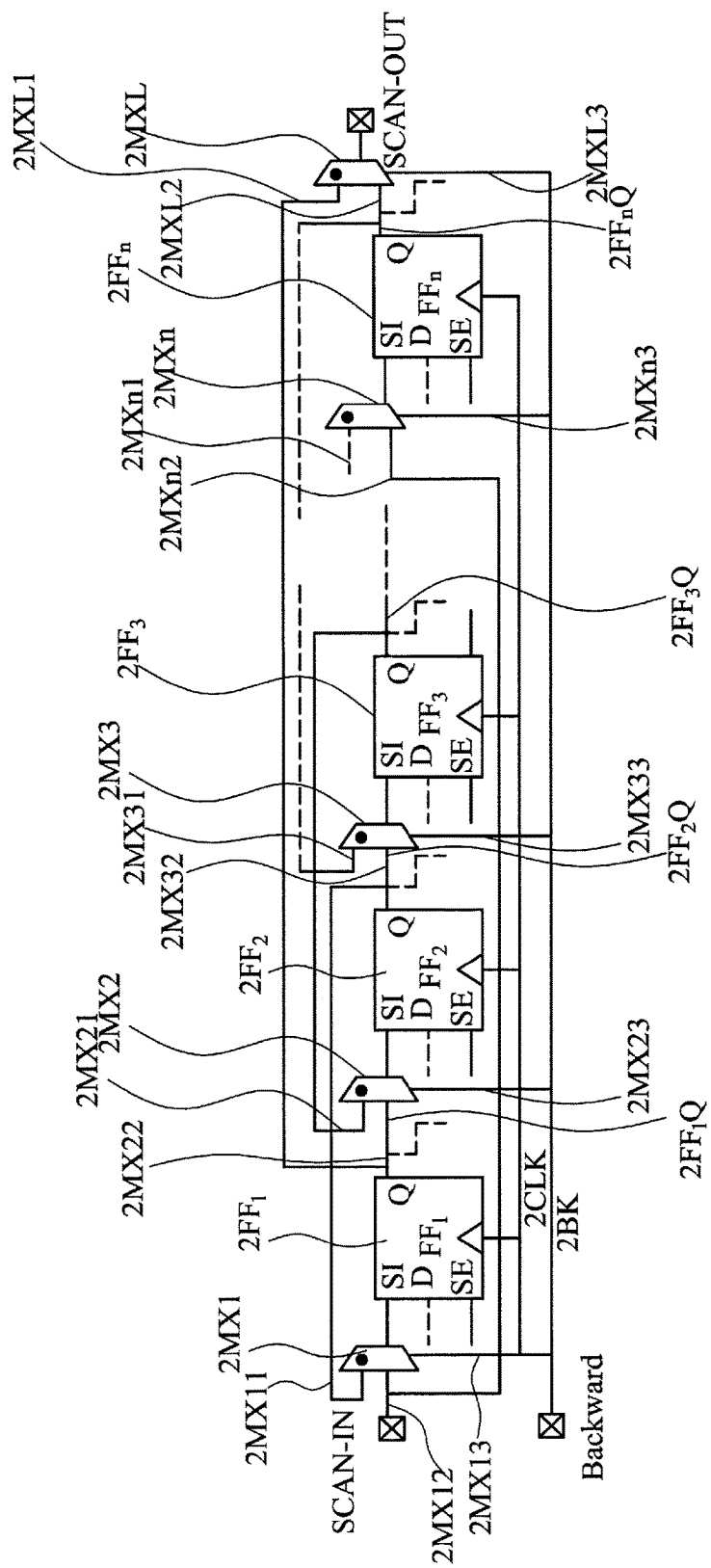
FIG. 2 is a schematic diagram illustrating a bi-directional scan chain structure in accordance with some embodiments.

FIG. 2 is a schematic diagram illustrating a bi-directional scan chain structure in accordance with some embodiments. Compared to the one-directional scan chain structure in FIG. 1, the bi-directional scan chain structure includes additional multiplexers and different wirings. According to the naming convention discussed above, the first flip-flop is 2FF1, the second is 2FF2, the third is 2FF3, ... and the n-th flip-flop is 2FFn. The first multiplexer coupled to the first flip-flop 2FF1 is labeled as 2MX1, the second multiplexer coupled to the second flip-flop 2FF2 is labeled as 2MX2, and the n-th multiplexer coupled to the n-th flip-flop is labeled as 2MXn. There is an additional last multiplexer after the last (n-th) flip-flop that is labeled as 2MXL, with L designating "Last." Each multiplexer includes two inputs, for example, the two inputs of the first multiplexer is labeled as 2MX11 and 2MX12. Each multiplexer also includes a selector, for example, the selector signal of the first multiplexer is labeled as 2MX13. All the flip-flops in the scan chain are controlled by a clock signal CLK. The scan chain has a SCAN-IN, a SCAN-OUT and a BACKWARD control signal (e.g., a data control bit equal to 0 or 1), which functions as the selector signal as discussed in further detail below. The first flip-flop, the middle flip-flops and the last flip-flops are also discussed in further detail below with reference to FIG. 3A, FIG. 3B and FIG. 3C.

As shown in FIG. 2, the BACKWARD control signal is connected to the selector signal input (2MX13, 2MX23, 2MX33, ... 2MXn3 and 2MXL3) of each multiplexer in the scan chain. The SCAN-IN signal connects directly to the second inputs 2MX12 of the first multiplexer 2MX1 and the second input 2MXn2 of the n-th multiplexer 2MXn corresponding to the last flip-flop 2FFn. The BACKWARD control signal, the clock signal, and the SCAN-IN signals may be provided by one or more processors or devices (not shown) located on-chip or off-chip, in accordance with various embodiments. The Q output 2FFnQ of the last flip-flop 2FFn connects back to one of the inputs of the (n−1)th multiplexer corresponding to the (n−1)th flip-flop (not shown in the figure). The backward connection continues, until the third flip-flop 2FF3 receives connection from the fourth flip-flop (not shown in the figure) through the third multiplexer 2FF3's first input 2MX31. Then the Q output of 2FF3Q of the third flip-flop 2FF3 connects back to the input 2MX21 of the second multiplexer 2MX2 corresponding to the flip-flop 2FF2. Finally, the 2FF2Q connects back to 2MX11 to complete the backward chain. In addition, 2FF1Q directly connects to the first input 2MXL1 of the last multiplexer 2MXL after the last flip-flop 2FFn. The output of the last multiplexer is SCAN-OUT. A backward scanning mechanism, in accordance with some embodiments, is discussed in further detail below. According to some embodiments, the selector signals 2MX13, 2MX23, 2MX33, ... 2MXn3 are independently controlled by independent pins or on-chip registers. The operation of the bi-direction scan chain if FIG. 2 is described in further detail below in connection with FIGS. 4A and 4B.

FIG. 3A is a schematic diagram illustrating the "first cell" structure in the bi-directional scan chain structure in accordance with some embodiments. The first cell includes the first flip-flop 3FF1 and the first multiplexer 3MX1. As discussed in FIG. 2, the input 3MX11 of the first multiplexer 3MX1 connects to the Q output of the second flip-flop 3FF2 (not shown in the figure). 3MX12 is the SCAN-IN, and 3MX13 is the selector signal provided by the BACKWARD control signal, in accordance some embodiments.

FIG. 3B is a schematic diagram illustrating the "middle cell" structure in the bi-directional scan chain structure in accordance with some embodiments. The middle cell 3FFk has a similar configuration as the first cell, the difference is that the 3MXk1 is connected to the Q output of the 3FF(k+1), the 3MXk2 is connected to Q output of the 3FF(k−1) instead of the SCAN-IN. Here "k" denotes a number between 1 and n.

FIG. 3C is a schematic diagram illustrating the "last cell" structure in the bi-directional scan chain structure in accordance with some embodiments. Compared to the middle cell, the last cell includes an additional multiplexer 3MXL after the n-th flip-flop 3FFn. The input 3MXL1 is connected to the Q output of the first flip-flop 3FF1 and the other input 3MXL2 is connected to the Q output of the last flip-flop 3FFn. The last multiplexer 3MXL is also controlled by the BACKWARD control signal. The input 3MXn2 is connected to the SCAN-IN.

FIG. 4A is a schematic diagram illustrating a forward scanning operation of a bi-directional scan chain when the selector signal BACKWARD=0, in accordance with some embodiments. When BACKWARD control signal is 0, the forward scan mechanism is implemented, and the forward scan path indicated by bold lines follows the following order: SCAN-IN, 4MX12, 4FF1SI, 4FF1Q, 4MX22, 4FF2SI, 4FF2Q, 4MX32, 4FF3SI, 4FF3Q, ... 4MXn2, 4FFnSI, 4FFnQ, SCAN-OUT.

FIG. 4B is a schematic diagram illustrating a backward scanning operation of the bi-directional scan chain when BACKWARD=0, in accordance with some embodiments. When the BACKWARD control signal is 1, the backward scan mechanism is implemented. The backward scan path indicated by bold lines follows the following order: SCAN-IN, 4MXn2, 4FFnSI, 4FFnQ, 4MX(n−1) 1, . . . , 4MX31, 4FF3SI, 4FF3Q, 4MX21, 4FF2SI, 4FF2Q, 4MX11, 4FF1SI, 4FF1Q, 4MXL1, SCAN-OUT. As illustrated above, the SCAN-IN is directly fed to the last multiplexer and the last flip-flop, then transmits backwards to the first flip-flop, then transmits to the SCAN-OUT.

Figure 5A:
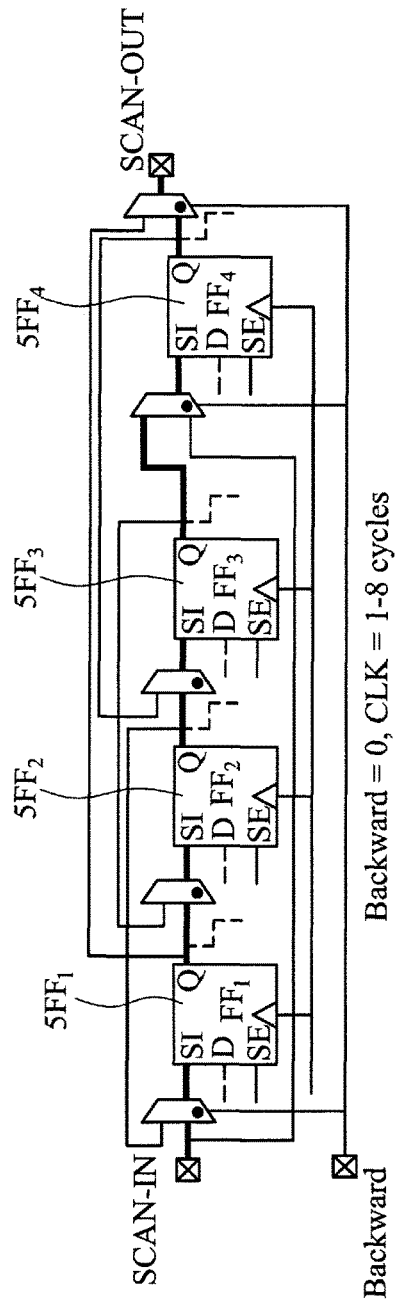
FIG. 5A is a schematic diagram illustrating a forward shift-in and a forward shift-out on a bi-directional scan chain in accordance with some embodiments.

FIG. 5A is a schematic diagram illustrating a forward shift-in and a forward shift-out operation of a bi-directional scan chain in accordance with some embodiments. In FIG. 5A, a scan chain comprising four flip-flops is used as an example to illustrate various combinations of forward and backward shift-in and shift-out operations. For a scan chain with four flip-flops (5FF1, 5FF2, 5FF3 AND 5FF4), the BACKWARD control signal is kept at 0 for the four shift-in clock cycles and the subsequent four shift-out clock cycles. As discussed above, when BACKWARD is 0, the forward scan is implemented for both the shift-in and the shift-out. The forward scan path for both the shift-in and the shift-out is the same: SCAN-IN, 5MX12, 5FF1SI, 5FF1Q, 5MX22, 5FF2SI, 5FF2Q, 5MX32, 5FF3SI, 5F3Q, 5MX41, 5FF4SI, 5FF4Q, 5MXL2 and SCAN-OUT.

Figure 5B:
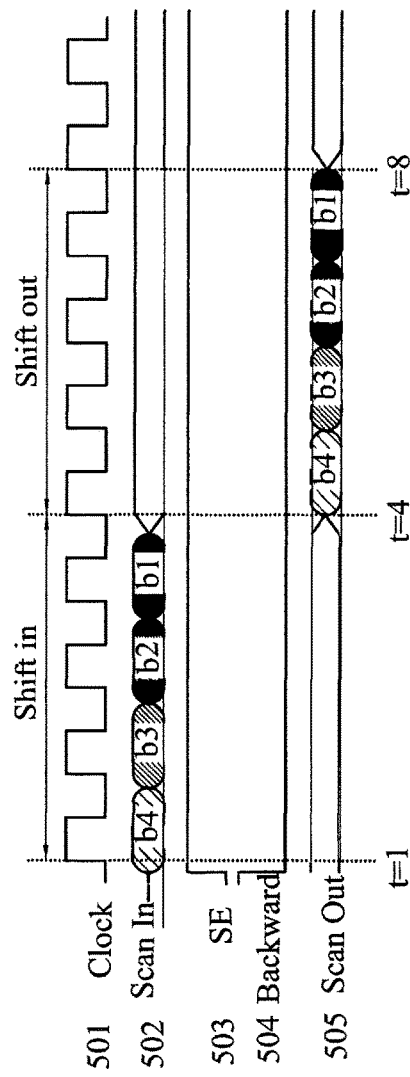
FIG. 5B is a timing diagram illustrating clock cycles corresponding to a forward shift-in and a forward shift-out on a bi-directional scan chain in accordance with some embodiments.

FIG. 5B is a timing diagram illustrating the clock cycles corresponding to the forward shift-in and the forward shift-out on the bi-directional scan chain in accordance with some embodiments. The clock 501 initially includes four cycles as shift-in cycles, and the next four cycles are shift-out cycles. During the first four cycles, on SCAN-IN path 502, four values (b1, b2, b3, b4) are shifted-in in the forward order b1, b2, b3, b4. The SE (shift-enabled) signal 503 is enabled for all clock cycles (this is the case for all subsequent figures and discussions). The BACKWARD signal 504 is kept at 0 throughout all clock cycles. When the shift-in finishes at the fourth clock cycle, 5FF1=b4, 5FF2=b3, 5FF3=b2, 5FF4=b1. Then the shift-out starts on SCAN-OUT path 505, the forward shift-out order is 5FF4, 5FF3, 5FF2, 5FF1, which produces bit values b1, b2, b3, b4 on the SCAN-OUT path 505.

Figure 6A:
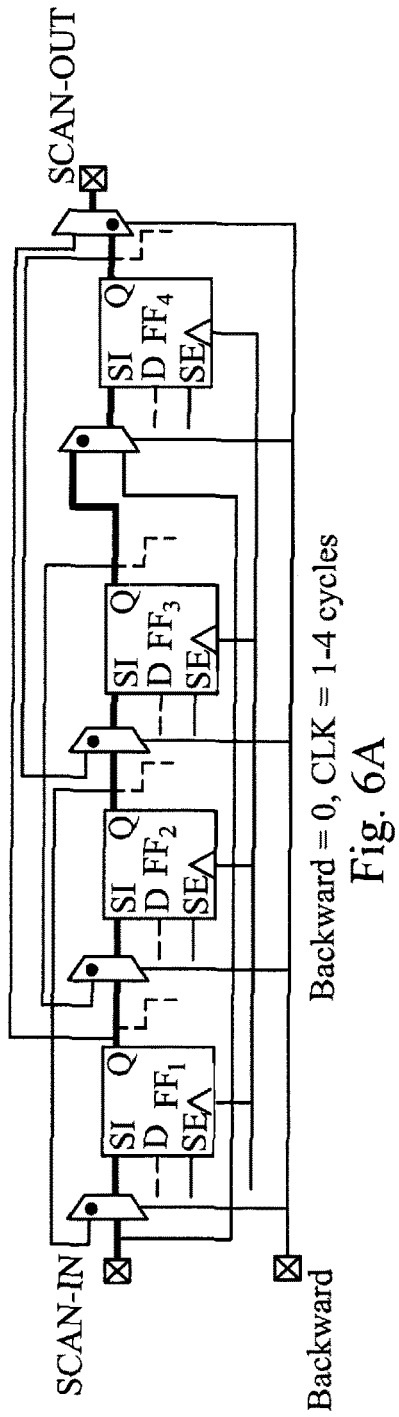
FIG. 6A is a schematic diagram illustrating the forward shift-in mechanism on the bi-directional scan chain in accordance with some embodiments.

FIG. 6A is a schematic diagram illustrating a forward shift-in mechanism on a bi-directional scan chain in accordance with some embodiments. Similar to the forward scan path in FIG. 5A, the forward scan path for the first four clock cycles when BACKWARD=0 is: SCAN-IN, 6MX12, 6FF1SI, 6FF1Q, 6MX22, 6FF2SI, 6FF2Q, 6MX32, 6FF3SI, 6F3Q, 6MX41, 6FF4SI, 6FF4Q, 6MXL2 and SCAN-OUT.

Figure 6B:
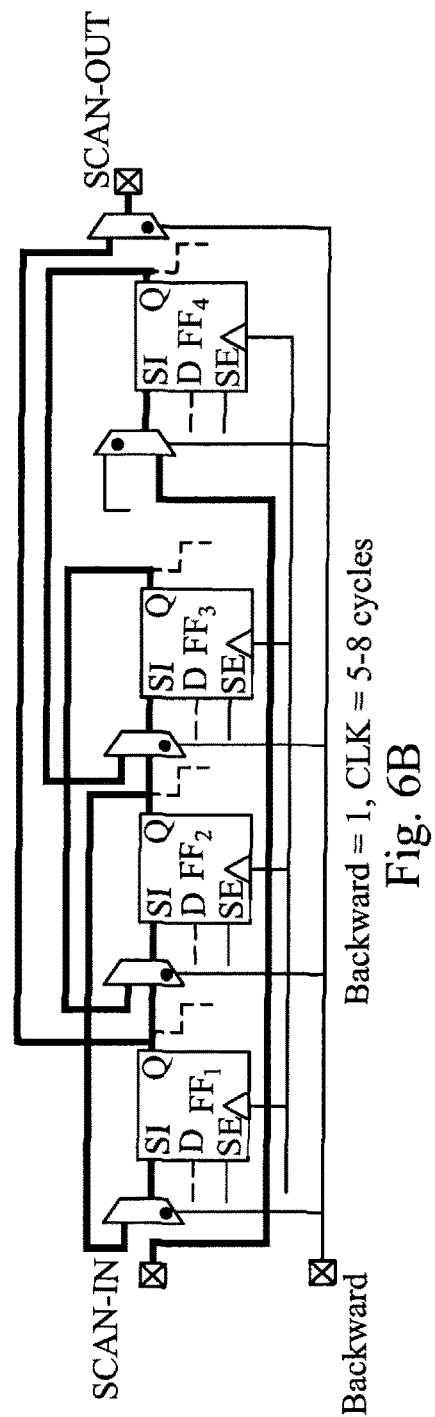
FIG. 6B is a schematic diagram illustrating a backward shift-out mechanism on a bi-directional scan chain in accordance with some embodiments.

FIG. 6B is a schematic diagram illustrating the backward shift-out mechanism on the bi-directional scan chain in accordance with some embodiments. After the first four clock cycles in FIG. 6A, BACKWARD control signal is turned to 1, and backward scan path is implemented for clock cycles 5-8. The back ward scan path is: SCAN-IN, 6MX42, 6FF4SI, 6FF4Q, 6MX31, 6FF3SI, 6FF3Q, 6MX21, 6FF2SI, 6FF2Q, 6MX11, 6FF1SI, 6FF1Q, 6MXL1 and SCAN-OUT. During the first four cycles of forward shift in, the four values are shifted-in in the forward order, at the end of the forward shift-in clock cycles, 6FF1=b4, 6FF2=b3, 6FF3=b2, 6FF4=b1. At the end of the fourth clock cycle, BACKWARD control signal is switched from 0 to 1 as illustrated in 604. As a result, backward shift-out starts from the fifth clock cycle. The backward shift-out starts from the last flip-flop and the order is: 6FF1, 6FF2, 6FF3, 6FF4, which produces b4, b3, b2, b1 on the SCAN-OUT.

Figure 6C:
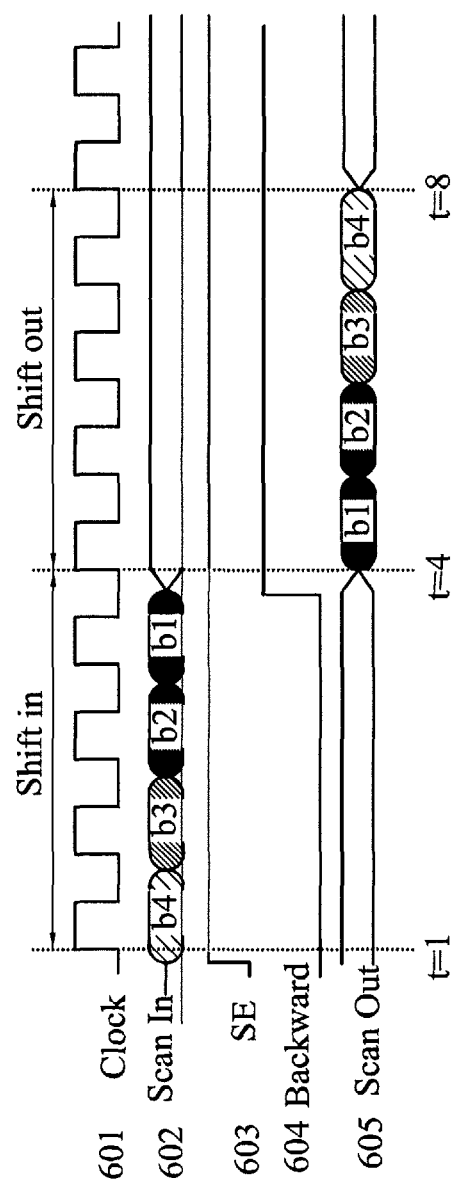
FIG. 6C is a timing diagram illustrating clock cycles corresponding to a forward shift-in and a backward shift-out on a bi-directional scan chain in accordance with some embodiments.

FIG. 6C is a timing diagram illustrating the clock cycles corresponding to the forward shift-in and the backward shift-out on the bi-directional scan chain in accordance with some embodiments. The difference between FIG. 6C and FIG. 5B is that the BACKWARD signal 604 is switched from 0 to 1 at the end of the fourth clock cycle, and as a result, the SCAN-OUT receives bit values b4, b3, b2, b1, in reverse order to that discussed above with respect to FIG. 5B.

Figure 7A:
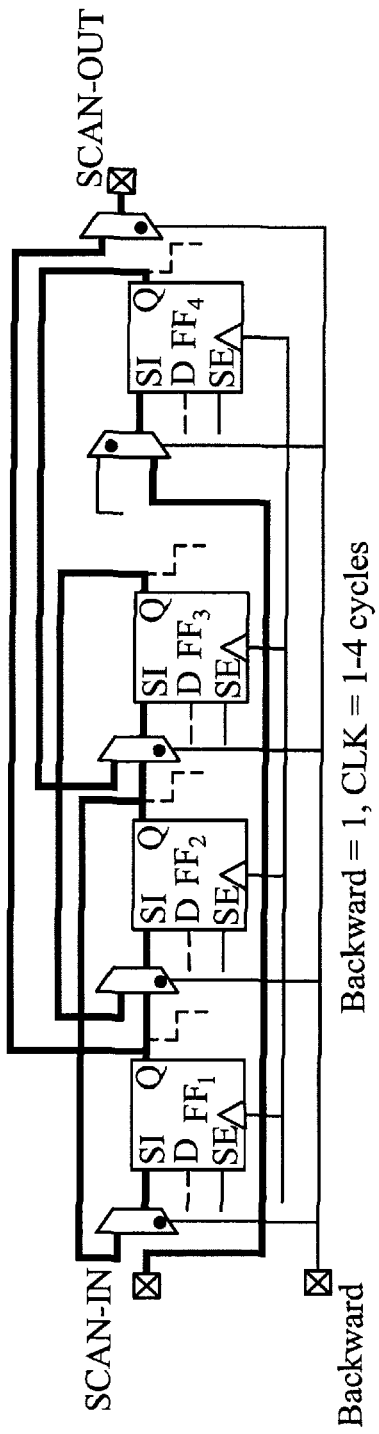
FIG. 7A is a schematic diagram illustrating a backward shift-in on a bi-directional scan chain in accordance with some embodiments.

FIG. 7A is a schematic diagram illustrating a backward shift-in operation of a bi-directional scan chain in accordance with some embodiments. The BACKWARD control signal is 1 for the first four shift-in clock cycles, and the backward scan path is: SCAN-IN, 7MX42, 7FF4SI, 7FF4Q, 7MX31, 7FF3SI, 7FF3Q, 7MX21, 7FF2SI, 7FF2Q, 7MX11, 7FF1SI, 7FF1Q, 7MXL1 and SCAN-OUT.

Figure 7B:
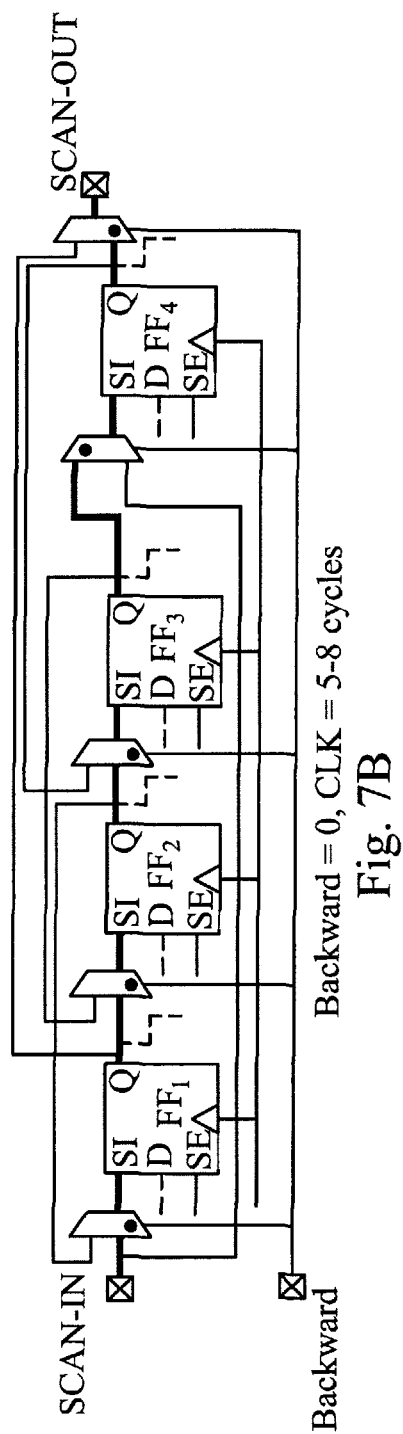
FIG. 7B is a schematic diagram illustrating a forward shift-out on a bi-directional scan chain in accordance with some embodiments.

FIG. 7B is a schematic diagram illustrating a forward shift-out operation of a bi-directional scan chain in accordance with some embodiments. The BACKWARD control signal is 0 for the next four shift-out clock cycles, and the forward scan path is: SCAN-IN, 7MX12, 7FF1SI, 7FF1Q, 7MX22, 7FF2SI, 7FF2Q, 7MX32, 7FF3SI, 7F3Q, 7MX41, 7FF4SI, 7FF4Q, 7MXL2 and SCAN-OUT.

Figure 7C:
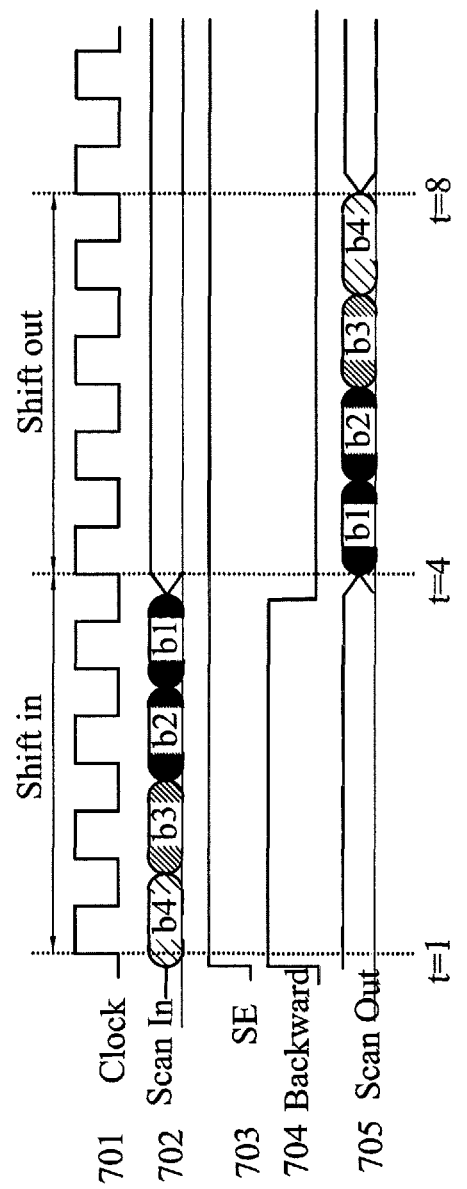
FIG. 7C is a timing diagram illustrating the clock cycles corresponding to the backward shift-in and the forward shift-out on the bi-directional scan chain in accordance with some embodiments.

FIG. 7C is a timing diagram illustrating the clock cycles corresponding to the backward shift-in and the forward shift-out on the bi-directional scan chain in accordance with some embodiments. The BACKWARD control signal 704 is switched from 1 to 0 at the end of the fourth clock cycle. At the end of the fourth clock cycle after the backward shift-in, 7FF1=b1, 7FF2=b2, 7FF3=b3, 7FF4=b4. When the BACKWARD signal is switched to 0 for forward shift-out for the next four clock cycles, the shift-out order is: 7FF4, 7FF3, 7FF2, 7FF1, which produces b4, b3, b2, b1 on the SCAN-OUT.

Figure 8A:
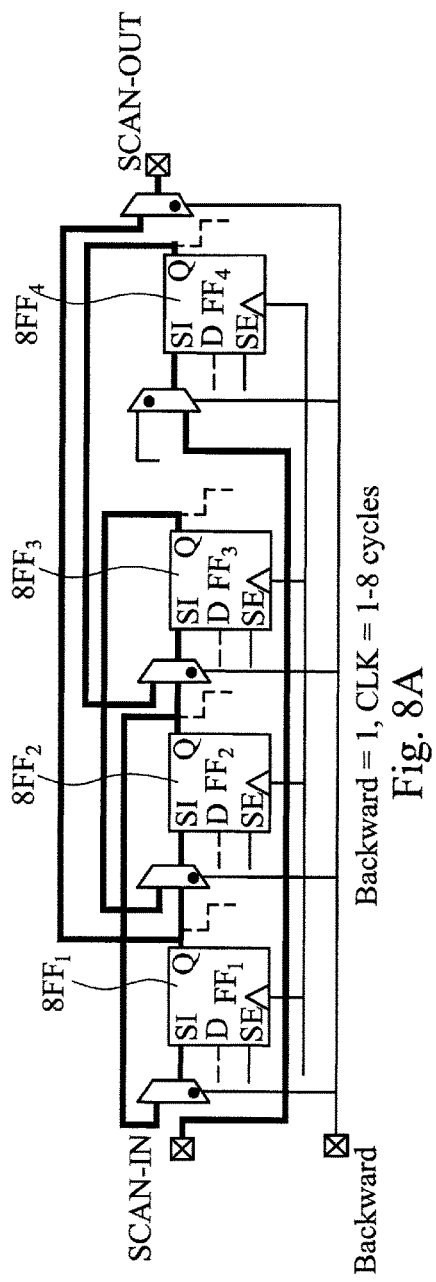
FIG. 8A is a schematic diagram illustrating a backward shift-in and a backward shift-out on a bi-directional scan chain in accordance with some embodiments.

FIG. 8A is a schematic diagram illustrating the backward shift-in and the backward shift-out on the bi-directional scan chain in accordance with some embodiments. The BACKWARD control signal is 1 for all eight clock cycles, and the backward scan path is: SCAN-IN, 8MX42, 8FF4SI, 8FF4Q, 8MX31, 8FF3SI, 8FF3Q, 8MX21, 8FF2SI, 8FF2Q, 8MX11, 8FF1SI, 8FF1Q, 8MXL1 and SCAN-OUT.

Figure 8B:
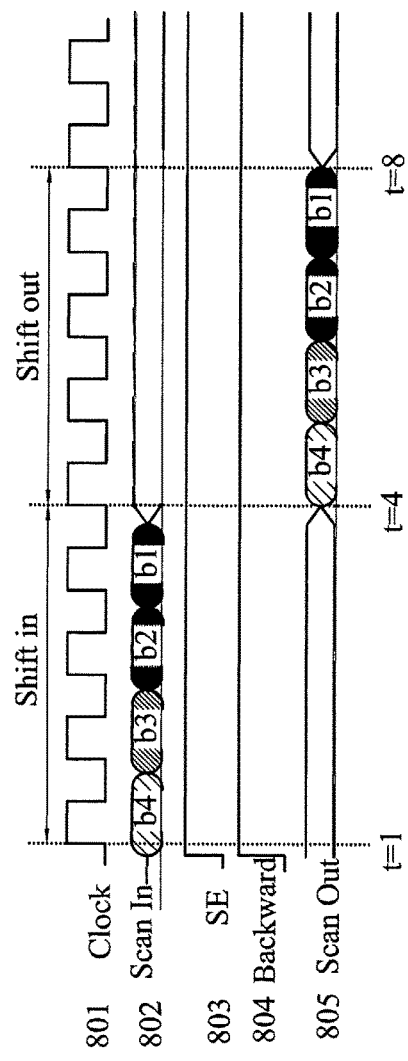
FIG. 8B is a timing diagram illustrating clock cycles corresponding to a backward shift-in and a backward shift-out on a bi-directional scan chain in accordance with some embodiments.

FIG. 8B is a timing diagram illustrating the clock cycles corresponding to the backward shift-in and the backward shift-out operations of a bi-directional scan chain in accordance with some embodiments. In contrast to FIG. 7B, the BACKWARD control signal is kept at 1 for all eight clock cycles. At the end of the shift-in clock cycles, 8FF1=b1, 8FF2=b2, 8FF3=b3, 8FF4=b4. The backward shift-out follows the backward order: 8FF1, 8FF2, 8FF3, 8FF4, which produces b1, b2, b3, b4 on the SCAN-OUT.

In accordance with some embodiments, the BACKWARD signal can be switched between 1 and 0 at any desired clock cycle to produce a variety of combinations of forward and backward shift-in operations, and a variety of combinations of forward and backward shift-out operations. According to some embodiments, for example, a shift-in operation includes n clock cycles of forward shift operations and m clock cycles of backward shift operations, and the shift-out operation includes k clock cycles of forward shift operations and p clock cycles of backward shift operations, where n, m, k and p are non-negative integers. According to some embodiments, n+m=k+p. According to other embodiments, n+m does not have to be equal to k+p.

Figure 9:
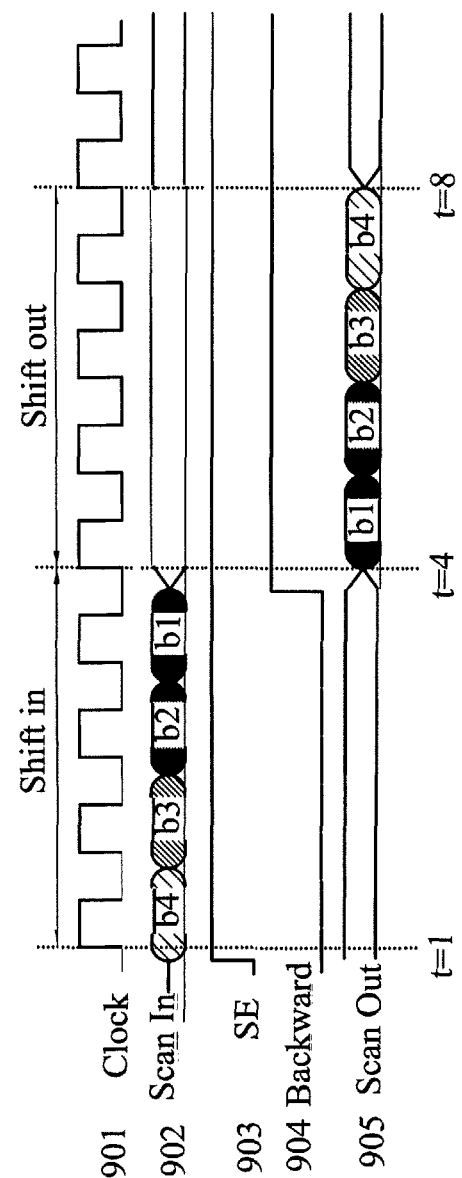
FIG. 9 is a timing diagram illustrating clock cycles corresponding to a mixed order shift-in and a mixed order shift-out on a bi-directional scan chain in accordance with some embodiments.
Figure 10A:
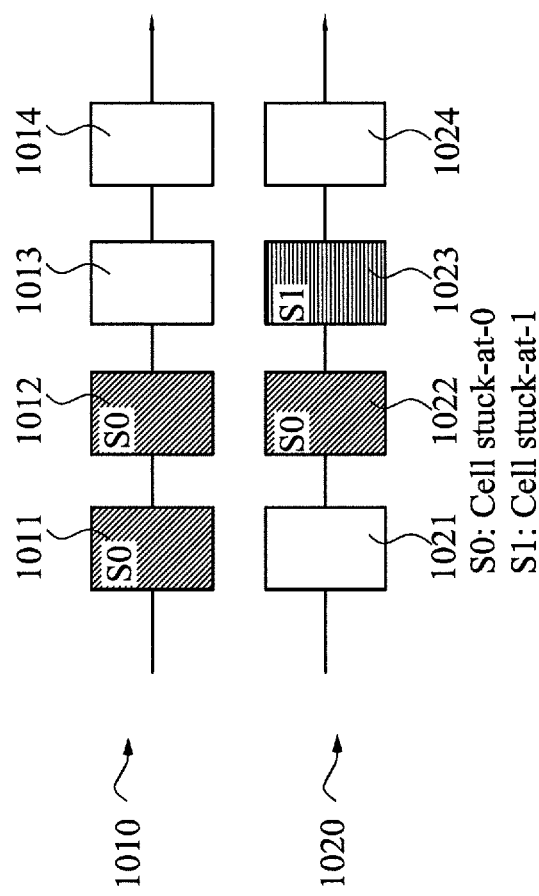

FIG. 9 is a timing diagram illustrating the clock cycles corresponding to a mixed order shift-in and shift-out operation of a bi-directional scan chain in accordance with some embodiments. As an example, forward shift cycles n=1, and backward shift cycles m=3, for shift-in, which produces 9FF1=b1, 9FF2=b2, 9FF3=b3 and 9FF4=b4. For shift-out, for example, forward shift cycles k=2, and backward shift cycles p=2, which produces the shift-out order of: 9FF4, 9FF3, 9FF1, 9FF2. As a result the sequence of b4, b3, b1, b2 is produced on SCAN-OUT.

FIG. 10A through FIG. 10K illustrate the steps of a method of detecting multiple defects of one or more faulty chains using a bi-directional scan chain in accordance with some embodiments. In some embodiments, the method detects all defect types: stuck-at, transition, or both. The method also pin-points the locations of various types of defects.

FIG. 10 A illustrates two scan chains 1010 and 1020. The first chain 1010 includes four flip-flops 1011, 1012, 1013 and 1014, and the second scan chain also includes four flip-flops 1021, 1022, 1023 and 1024. The first scan chain 1010 includes two defective flip-flops 1011 and 1012, both of which have stuck-at-0 defects (S0) illustrated by diagonal shade lines. The second scan chain 1020 also includes two defective flip-flops 1022 and 1023, one of which is also has a stuck-at-0 defect (1022, S0) illustrated by diagonal shade lines, while the other has a stuck-at-1 defect (1023, S1) illustrated by horizontal shade lines. According to some embodiments, the goal of the multiple defect detection of multiple faulty chains is to detect the types of defects S0 and S1, as well as the locations (1011, 1012, 1022, 1023) of the defects. Through a combination of forward and backward shift-in and shift-out operations, as illustrated and discussed above with respect to FIGS. 5A through 9B, the goal can be achieved. Exemplary steps of such detection methods are discussed in further detail below.

FIG. 10B and FIG. 10C illustrate an exemplary first step of detecting multiple defects, in accordance with some embodiments. The first step has two sub-steps, the first sub-step (FIG. 10B) includes a forward shift-in operation and the second sub-step (FIG. 10C) includes forward shift-out operation. The details of forward shift-in and forward shift-out are discussed in connection with FIGS. 5A and 5B above.

As discussed above, in the first sub-step in FIG. 10B, the BACKWARD signal is set to 0 during both the shift-in and the shift-out operations. As one example, the input to the first scan chain 1010 is provided as 1111. Due to the stuck-at-0 defects at flip-flops 1011 and 1012, however, the output of the scan chain 1010 is 0000. Similarly, the input to the scan chain 1020 is also provided as 1111. Due to the stuck-at-1 defect at flip-flop 1023, however, the output of the scan chain 1020 is 1111. Conclusion can be drawn that there is a stuck-at-0 defect in the scan chain 1010, but the exact location cannot be determined at this step. The location of the stuck-at-0 defect can be anywhere in the scan chain 1010. Based on the output 1111 of the scan chain 1020, no conclusions can be drawn regarding stuck-at-0 or stuck-at-1 defects yet.

In the second sub-step in FIG. 10C, BACKWARD is 0 for the shift-out operation and the input 0000 is fed into the first scan chain 1010, and the output is 0000. When input 0000 is fed into the second scan chain 1020, the output is 1111. A conclusion regarding the second scan chain 1020 can be drawn that there is a stuck-at-1 defect in the scan chain 1020. But the exact location of the stuck-at-1 defect cannot be determined at this step.

FIG. 10D and FIG. 10E illustrate an exemplary second step of detecting multiple defects in one or more scan chains, in accordance with some embodiments. The second step has two sub-steps, the first sub-step (FIG. 10D) includes a backward shift-in operation and the second sub-step (FIG. 10E) includes a backward shift-out operation. The details of backward shift-in and backward shift-out operation are discussed in FIG. 8A and FIG. 8B.

As discussed above in connection with FIGS. 8A and 8B, in the first sub-step in FIG. 10D, the BACKWARD control signal is set to 1 during both the shift-in and shift-out operations. An exemplary input to the first scan chain 1010 is provided as 1111. Due to the stuck-at-0 defects at flip-flops 1011 and 1012, the output of the scan chain 1010 is still 0000. The same conclusion can be drawn regarding the first scan chain that there is a stuck-at-0 defect in the first scan chain, but the location of the defect cannot be determined at this step. Then the input 1111 is fed into the second scan chain in backward shift-in and backward shift-out, according to the discussion in FIG. 8A and FIG. 8B, the output is 0000. Based on this result, a conclusion can be drawn that there is a stuck-at-0 defect in the second scan chain 1020 in addition to the stuck-at-1 defect detected in the first step. The location of the stuck-at-0 defect must be prior to the stuck-at-1 defect in the scan chain but cannot be precisely determined at this step.

In the second sub-step in FIG. 10E, the BACKWARD control signal is set to 0 for both shift-in and shift-out operations. An input 0000 is fed into the first scan chain 1010, the output is 0000 according to the discussion in FIG. 8A and FIG. 8B, no further conclusion can be drawn based on this outcome. Input 0000 is also fed into the second scan chain 1020, and the output is again 0000. The conclusion that can be drawn after the second step is: there is at least a stuck-at-0 defect in the first scan chain 1010; there is at least a stuck-at-0 defect and a stuck-at-1 defect in the second scan chain 1020, where the stuck-at-0 defect is prior to the stuck-at-1 defect in the second scan chain 1020 when shifting in the forward direction.

FIGS. 10F and 10G illustrate an exemplary third step of detecting multiple defects in multiple faulty chains in accordance with some embodiments. The third step also has two sub-steps, the first sub-step (FIG. 10F) and the second sub-step (FIG. 10G) are forward shift-in and backward shift-out operations, respectively. The details of forward shift-in and backward shift-out are discussed in connection with FIGS. 6A, 6B and 6C above. In the first sub-step, the BACKWARD signal is 0 for the shift-in operation, while in the second sub-step, the BACKWARD signal is 1 for the shift-out operation. An exemplary input of 1111 is fed into both the first scan chain 1010 and the second scan chain 1020. The output of the first scan chain is 0000 and the output of the second scan chain is 1000. Based on the output 1000 of the second scan chain, a conclusion can be drawn that there is a stuck-at-0 defect at the second flip-flop cell 1022 in the second scan chain 1020. For the second sub-step, the BACKWARD control values are the same as the values for first sub-step, but the input 0000 is fed into the first scan chain 1010 and the second scan chain 1020. The outputs for both scan chains are 0000. No further conclusion can be drawn from this second sub-step.

FIGS. 10H and 10I illustrate an exemplary fourth step having two sub-steps, the first sub-step illustrated in FIG. 10H and the second sub-step illustrated in FIG. 10I. In both sub-steps, the BACKWARD control signal is set to 1 for the shift-in operation and set to 0 for the shift-out operation. The backward shift-in and forward shift-out operations are discussed in detail in connection with FIGS. 7A, 7B and 7C above.

In FIG. 10H, an exemplary input 1111 is fed into the first scan chain 1010, which results in an output of 0011. Based on this result, a conclusion can be drawn that there is a stuck-at-0 defect at the second flip-flop cell 1012 of scan chain 1010. When the input 1111 is fed into the second scan chain 1020, the output is 1111. No further conclusions can be drawn from this result.

During the second sub-step of the fourth step, as shown in FIG. 10I, an input 0000 is fed into the first scan chain 1010, resulting in an output of 0000. No further conclusions can be drawn from this step. However, when the input 0000 is fed into the second scan chain 1020, the output is 1110, which leads to the conclusion that there is a stuck-at-1 defect in scan chain 1020 at the third flip-flop cell 1023.

Thus far, the exact locations of three defect cells have been determined. To further determine the remaining defect cells in the scan chains, a mixed-order shift-in and shift-out operation can be implemented, in accordance with some embodiments. FIGS. 10J and 10K illustrate an exemplary mixed-order operation in which n=1 and m=3 is implemented for shift-in operations, and k=3 and p=1 is implemented for shift-out operations, where n is the number of forward shift cycles for a shift-in operation, m is the number of backward shift cycles for the shift-in operation, k is the number of forward shift cycles for a shift out operation and p is the number of backward shift cycles for the shift out operations. A mixed-order shift-in and shift-out scan chain is discussed in connection with FIG. 9 above.

Referring to FIG. 10J, when an input 1111 is fed into the first scan chain 1010, the output 0011 is obtained, which leads to the conclusion that there is a stuck-at-0 defect at the first flip-flop 1011 in the first scan chain 1010. When the input 1111 is fed into the second scan chain 1020, the output 1111 is obtained, which does not provide any further clues.

Referring to FIG. 10K, when the input 0000 is fed into the first scan chain 1010, the output is 0000, which does not provide any further information. When the input 0000 is fed into the second scan chain 1020, 0110 is obtained as the output, which leads to the conclusion that a stuck-at-0 defect exists in the second flip-flop 1022 of the second scan chain 1020.

As discussed above, all four defects in two defective scan chains 1010 and 1020 can be identified using the exemplary techniques of the present disclosure. The identified defects include not only information regarding the types of defects, but also the exact locations of the defective cells in each scan chain. Thus, a complete diagnosis for multiple defective chains having multiple defects can be achieved, in accordance with various embodiments. Thus, the method can efficiently and accurately identify problem cells in multiple defective scan chains, which in turn improves process yield ramp up time since the sooner defective cells and their defect types can be identified, the sooner the problem(s) can be fixed to rapidly arrive at a process with high/acceptable process yields.

According to some embodiments, a bi-directional scan chain is disclosed. In one exemplary embodiment, a bi-directional scan chain, includes: a first cell structure located at the beginning of the bi-directional scan chain, the first cell structure having a first storage device and a first multiplexer; a last cell structure located at the end of the bi-directional scan chain, the last cell structure having a last storage device, a last multiplexer and an end multiplexer; and at least one middle cell structure disposed between and coupled to the first and the last cell structures to form the bi-directional scan chain, the at least one middle cell structure having a middle storage device and a middle multiplexer, wherein each of the first, middle, last and end multiplexers includes a selector signal input for a receiving a selector signal that controls forward and backward data shift operations of the bi-directional scan chain.

According to further embodiments, a first input of the first multiplexer is configured to receive a SCAN-IN signal, a second input of the first multiplexer is coupled to an output of an immediately succeeding middle storage device, and an output of the first multiplexer is coupled to an input of the first storage device. Additionally, in accordance with some embodiments, a first input of each middle multiplexer is coupled to an output of an immediately preceding storage device, a second input of each middle multiplexer is coupled to an output of an immediately succeeding storage device in an immediately subsequent middle or last cell structure, and an output of each middle multiplexer is coupled to an input of a corresponding middle storage device in the same middle cell structure.

In further embodiments, a first input of the last multiplexer is configured to receive the SCAN-IN signal, a second input of the last multiplexer is coupled to an output of an immediately preceding middle storage device, an output of the last multiplexer is coupled to an input of the last storage device, an output of the last storage device is coupled to a first input of the end multiplexer, a second input of the end multiplexer is coupled to the output of the first storage device, and an output of the end multiplexer is coupled to a SCAN-OUT data node.

In some embodiments, a bi-directional scan chain includes a plurality of cell structures, each cell structure comprising a storage device and at least one multiplexer, the plurality of cell structures coupled to one another in a series configuration, wherein an output of a (K−1)-th cell structure is provided as input to the K-th cell structure to provide a forward data shifting operation, and an output of the K-th cell structure is provided as an input to the (K−1)-th cell structure to provide a backward data shifting operation, where K is an integer greater than 1.

In alternative embodiments, a method of performing a bi-directional scan chain operation is disclosed. The method includes: serially shifting in data bits into a plurality of storage devices, connected to each other in a series configuration, in a first direction for M clock cycles, where M is an integer greater than zero; and serially shifting out data bits from the plurality of storage devices in a second direction for N clock cycles, where N is an integer greater than zero, and wherein the second direction is opposite the first direction.

In some embodiments, the first direction comprises a forward shift direction and the second direction comprises a backward shift direction. In other embodiments, the first direction comprises a backward shift direction and the second direction comprises a forward shift direction. In yet further embodiments, M and N are equal to one another and each equal to a total number of storage devices in the plurality of storage devices. In alternative embodiments, the shifting in occurs in the first direction for M clock cycles and occurs in the second direction for P clock cycles, wherein P is an integer greater than zero, and M+P equals the total number of storage devices in the plurality of storage devices. In some embodiments, the shifting out occurs in the second direction for N clock cycles and occurs in the second direction for Q clock cycles, wherein Q is an integer greater than zero, and N+Q equals the total number of storage devices in the plurality of storage devices.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, although the exemplary embodiments disclosed herein are described as using flip-flop devices, any storage device capable of receiving, storing and outputting a data bit can be utilized in accordance with the teachings herein. Those skilled in the art should also realize that such equivalent structures and techniques do not depart from the spirit and scope of the present disclosure, and that they may make various changes, substitutions, and alterations herein without departing from the spirit and scope of the present disclosure.

What is claimed is:

1. A bi-directional scan chain, comprising:
   a first cell structure located at the beginning of the bi-directional scan chain, the first cell structure comprising a first storage device and a first multiplexer, wherein a first input of the first multiplexer is configured to receive a SCAN-IN signal;
   a last cell structure located at the end of the bi-directional scan chain, the last cell structure comprising a last storage device, a last multiplexer and an end multiplexer, wherein the end multiplexer is configured to generate a SCAN-OUT signal as an output of the bi-directional scan chain, and wherein a first input of the last multiplexer is configured to receive the SCAN-IN signal; and
   at least one middle cell structure coupled to the first cell structure and the last cell structure to form the bi-directional scan chain, the at least one middle cell structure comprising a middle storage device and a middle multiplexer,
   wherein each of the first, middle, last and end multiplexers comprises a selector signal input for receiving a selector signal that controls forward and backward data shift operations of the bi-directional scan chain.

2. The bi-directional scan chain of claim 1, wherein a second input of the first multiplexer is coupled to an output of an immediately succeeding middle storage device, and an output of the first multiplexer is coupled to an input of the first storage device.

3. The bi-directional scan chain of claim 2 wherein a first input of each middle multiplexer in each middle cell structure is coupled to an output of an immediately preceding storage device, a second input of each middle multiplexer is coupled to an output of an immediately succeeding storage device in the last cell structure or an immediately subsequent middle cell structure when the at least one middle cell structure includes multiple middle cell structures, and an output of each middle multiplexer is coupled to an input of a corresponding middle storage device in the same middle cell structure.

4. The bi-directional scan chain of claim 3 wherein a second input of the last multiplexer is coupled to an output of an immediately preceding middle storage device, and an output of the last multiplexer is coupled to an input of the last storage device.

5. The bi-directional scan chain of claim 4 wherein an output of the last storage device is coupled to a first input of the end multiplexer, and a second input of the end multiplexer is coupled to the output of the first storage device.

6. The bi-directional scan chain of claim 1, wherein the first, at least one middle and last storage devices, each comprise a flip-flop.

7. The bi-directional scan chain of claim 1, wherein the selector signal comprises a BACKWARD control bit that is set to 1 for backward data shifting and set to 0 for forward data shifting.

8. A bi-directional scan chain, comprising a plurality of cell structures, each cell structure comprising a storage device and at least one multiplexer, the plurality of cell structures coupled to one another in a series configuration, wherein
   an output of a (K−1)-th cell structure is provided as input to the K-th cell structure to provide a forward data shifting operation, and an output of the K-th cell structure is provided as an input to the (K−1)-th cell structure to provide a backward data shifting operation, where K is an integer greater than 1; and
   the plurality of cell structures comprises
      a first cell structure located at the beginning of the bi-directional scan chain, the first cell structure comprising a first storage device and a first multiplexer, wherein a first input of the first multiplexer is configured to receive a SCAN-IN signal, and
      a last cell structure located at the end of the bi-directional scan chain, the last cell structure comprising a last storage device, a last multiplexer and an end multiplexer, wherein a first input of the last multiplexer is configured to receive the SCAN-IN signal.

9. The bi-directional scan chain of claim 8, wherein the plurality of cell structures further comprises:
   K−1 middle cell structures disposed between the first cell structure and the last cell structure to form the bi-directional scan chain, the K−1 middle cell structures, comprising K−1 middle storage devices, and K−1 middle multiplexers,
   wherein each of the first, middle, last and end multiplexers comprises a selector signal input for receiving a selector signal that controls forward and backward data shift operations of the bi-directional scan chain.

10. The bi-directional scan chain of claim 9, wherein a second input of the first multiplexer is coupled to an output of an immediately succeeding middle storage device, and an output of the first multiplexer is coupled to an input of the first storage device.

11. The bi-directional scan chain of claim 10 wherein a first input of each middle multiplexer in each middle cell structure is coupled to an output of an immediately preceding storage device, a second input of each middle multiplexer is coupled to an output of an immediately succeeding storage device in the last cell structure or an immediately subsequent middle cell structure when the at least one middle cell structure includes multiple middle cell structures, and an output of each middle multiplexer is coupled to an input of a corresponding middle storage device in the same middle cell structure.

12. The bi-directional scan chain of claim 11 wherein a second input of the last multiplexer is coupled to an output of an immediately preceding middle storage device, and an output of the last multiplexer is coupled to an input of the last storage device.

13. The bi-directional scan chain of claim 12 wherein an output of the last storage device is coupled to a first input of the end multiplexer, a second input of the end multiplexer is coupled to the output of the first storage device.

14. The bi-directional scan chain of claim 8, wherein each storage device comprises a flip-flop.

15. A method of performing a bi-directional scan chain operation, comprising:
   serially shifting in data bits into a plurality of storage devices, connected to each other in a series configuration, in a first direction for M clock cycles and in a second direction for P clock cycles, wherein P is an integer greater than zero, where M is an integer greater than zero, wherein a sum of M and P equals a total number of storage devices in the plurality of storage devices; and serially shifting out data bits from the plurality of storage devices in the second direction for N clock cycles, where N is an integer greater than zero, and wherein the second direction is opposite the first direction.

16. The method of claim 15 wherein the first direction comprises a forward shift direction and the second direction comprises a backward shift direction.

17. The method of claim 15 wherein the first direction comprises a backward shift direction and the second direction comprises a forward shift direction.

18. The method of claim 15 wherein N is equal to a total number of storage devices in the plurality of storage devices.

19. The method of claim 15 wherein the shifting out occurs in the second direction for N clock cycles and occurs in the second direction for Q clock cycles, wherein Q is an integer greater than zero, and N+Q equals the total number of storage devices in the plurality of storage devices.

* * * * *